United States Patent
Chao

(10) Patent No.: US 7,679,075 B2
(45) Date of Patent: Mar. 16, 2010

(54) PHASE CHANGE MEMORY ARRAY AND FABRICATION THEREOF

(75) Inventor: Te-Sheng Chao, Taichung County (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

(*) Notice: Subject to any disclaimer, the term of this patent is extended or adjusted under 35 U.S.C. 154(b) by 51 days.

(21) Appl. No.: 12/020,494

(22) Filed: Jan. 25, 2008

(65) Prior Publication Data

US 2009/0065758 A1 Mar. 12, 2009

(30) Foreign Application Priority Data

Sep. 12, 2007 (TW) .............................. 96134007 A

(51) Int. Cl.
*H01L 47/00* (2006.01)

(52) U.S. Cl. ............................ 257/4; 257/5; 257/506; 257/E31.029; 365/148; 438/294; 438/900

(58) Field of Classification Search ................. 257/1–8, 257/215, 504, 506, E31.029; 365/148; 438/900, 438/75, 144, 207, 218, 294
See application file for complete search history.

(56) References Cited

U.S. PATENT DOCUMENTS

| | | | |
|---|---|---|---|
| 4,731,755 A | 3/1988 | Bjorklund et al. | |
| 6,605,821 B1 | 8/2003 | Lee et al. | |
| 6,969,633 B2 | 11/2005 | Dennison | |
| 2008/0237566 A1* | 10/2008 | An et al. | 257/4 |

* cited by examiner

*Primary Examiner*—Evan Pert
*Assistant Examiner*—Scott R Wilson
(74) *Attorney, Agent, or Firm*—Quintero Law Office

(57) ABSTRACT

A phase change memory array is disclosed, comprising a first cell having a patterned phase change layer, and a second cell having a patterned phase change layer, wherein the patterned phase change layer of the first cell and the patterned phase change layer of the second cell are disposed at different layers.

20 Claims, 18 Drawing Sheets

PHASE CHANGE MEMORY ARRAY AND FABRICATION THEREOF

BACKGROUND OF THE INVENTION

1. Field of the Invention

The invention relates to a semiconductor device and fabrication thereof, and more particularly relates to a phase change memory device and fabrication thereof.

2. Description of the Related Art

Phase change memory cell has many advantages, such as fast speed, lower power consumption, high capacity, robust endurance, easy embeddability in logic IC, and lower cost, so that it can serve as stand-alone or embedded memory devices with high integrity. Due to the described advantages, phase change memory has been considered the most promising candidate for the next-generation nonvolatile semiconductor memory which can replace the commercialized volatile memory, such as SRAM or DRAM, and non-volatile memory, such as flash.

The binary state switching in a phase change memory cell is accomplished by a fast and reversible phase transition between amorphous phase and crystalline phase in an active region of chalcogenide material, usually $Ge_2Sb_2Te_5$ (GST). The switching, which is induced by pulsed Joule heating, results in either a highly resistive RESET state or a low-resistance SET state, depending on if the phase is amorphous or crystalline, respectively.

Current pulses with different durations and amplitudes may be used to program the phase change memory cell. For example, the RESET current pulse with higher amplitude and shorter width, such as 0.6 mA with 50 ns, is applied to melt the GST alloy and the melted GST alloy is then rapidly quenched to be frozen to form the disordered structure (RESET state). The RESET state of the phase change memory cell has a higher resistance ranging from $10^5$ to $10^7$ ohm and the phase change memory cell presents a higher voltage when a current is applied for reading. On the other hand, the SET current pulse has lower amplitude and longer time (for example, 0.3 mA and 100 ns) so as to effectively crystallize the disordered GST alloy with sufficient time. Due to low-resistance SET state ranging from $10^2$ to $10^4$ ohm, the phase change memory cell presents a lower voltage when a current is applied for reading. The programming of phase change memory cell is according to the above described method.

In recent years, the size and cell spacing of the phase change memory cell have been continuously shrunk with the development of phase change memory technology. FIG. 1 shows a plane view of a phase change memory array. As shown in FIG. 1, the size of the unit cell 102 determines the density of the phase change memory. If the size of the unit cell 102 can be shrunk to 5.8 $F^2$, the distance d between neighboring cells 102 is reduced to only 2.4 F. The short neighboring distance may cause issues related to programming disturbs or thermal crosstalk between the phase change memory cells 102. The state of the phase change memory cell 102 may be affected due to the programming disturbs of neighboring memory cells.

BRIEF SUMMARY OF INVENTION

According to the issues described previously, an embodiment of the invention which increases the distance between two neighboring memory cells by forming the phase change memory cells at different layers is disclosed to eliminate the programming disturbs of phase change memory.

In an embodiment of the invention, a phase change memory array is disclosed, comprising a first cell having a patterned phase change layer, and a second cell having a patterned phase change layer, wherein the patterned phase change layer of the first cell and the patterned phase change layer of the second cell are disposed at different layers.

In another embodiment of the invention, a method for forming a phase change memory array is disclosed, comprising providing a substrate, forming a bottom electrode, a patterned phase change layer and a top electrode of a first cell on the substrate, and forming a bottom electrode, a patterned phase change layer and a top electrode of a second cell after forming the top electrode of the first cell.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense, not for limiting the invention.

Figure 1:
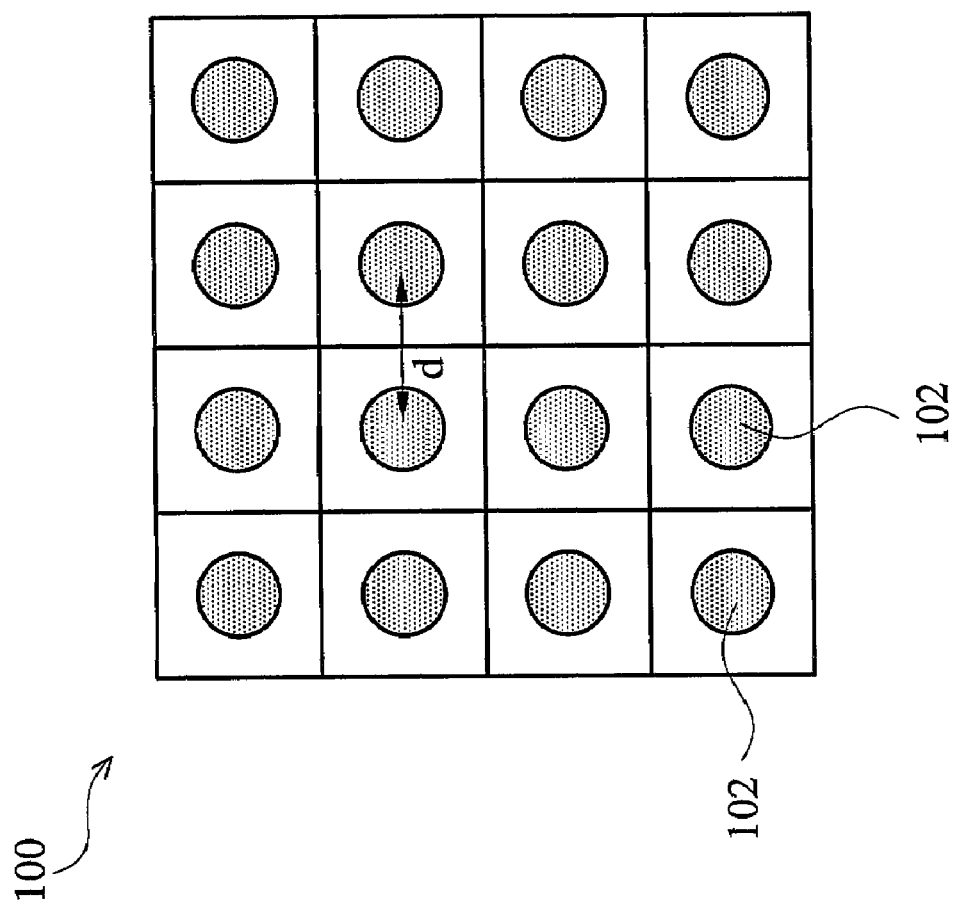
FIG. 1 shows a plan view of a phase change memory array.
Figure 2A:
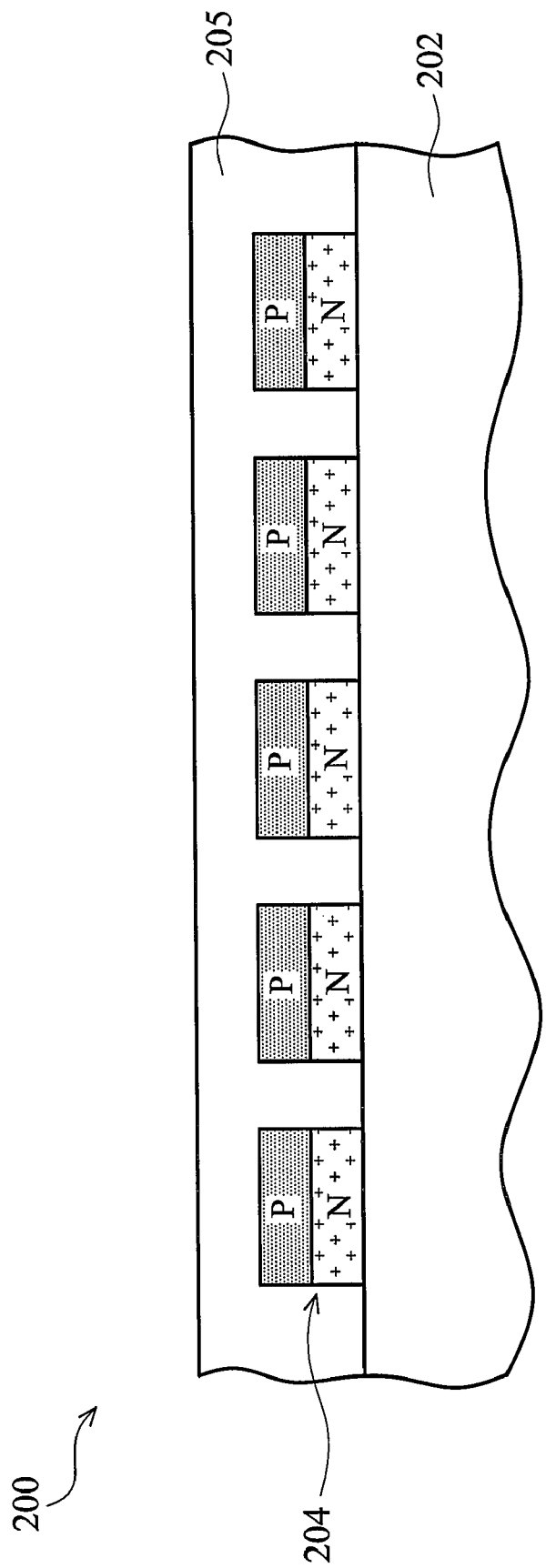
FIG. 2A~FIG. 2H illustrate the fabrication flow of a phase change memory array of an embodiment of the invention.

FIG. 2A~FIG. 2H illustrate the fabrication flow of a phase change memory array 200 of an embodiment of the invention. Referring to FIG. 2A, a substrate 202, such as silicon or other semiconductor material, is provided. Next, a plurality of switch devices 204 are formed on the substrate 202. In the embodiment, the switch devices 204 are vertical diodes, each comprising a p type semiconductor layer and an n type semiconductor layer, or other devices such as bipolar junction transistors (BJT) or metal oxide field effect transistors (MOSFET). A first dielectric layer 205, such as silicon oxide, silicon nitride or silicon oxynitride, is formed on the switch devices 204 and the substrate 202.

Figure 2B:
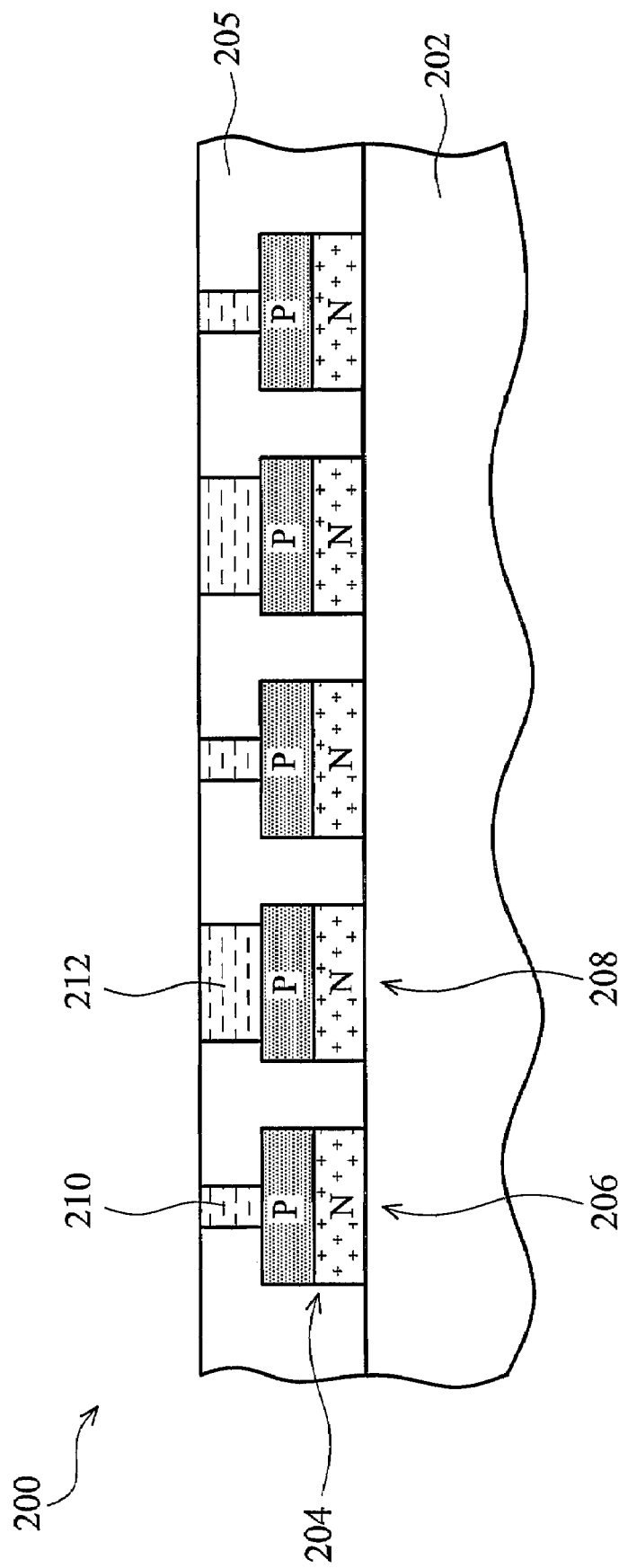

Referring to FIG. 2B, the first dielectric layer 205 is patterned using, for example, lithography and etching, to form openings (not shown) exposing the switch devices 204, followed by filling of the openings with a conductive material, such as Ti, W, Ta, TiN, TiW, TaN, TaW, TiAl, TiWN, TiAlN, or poly silicon to form a bottom electrode 210 of the first cell 206 and a portion 212 of the interconnect of the second cell 208.

Figure 2C:
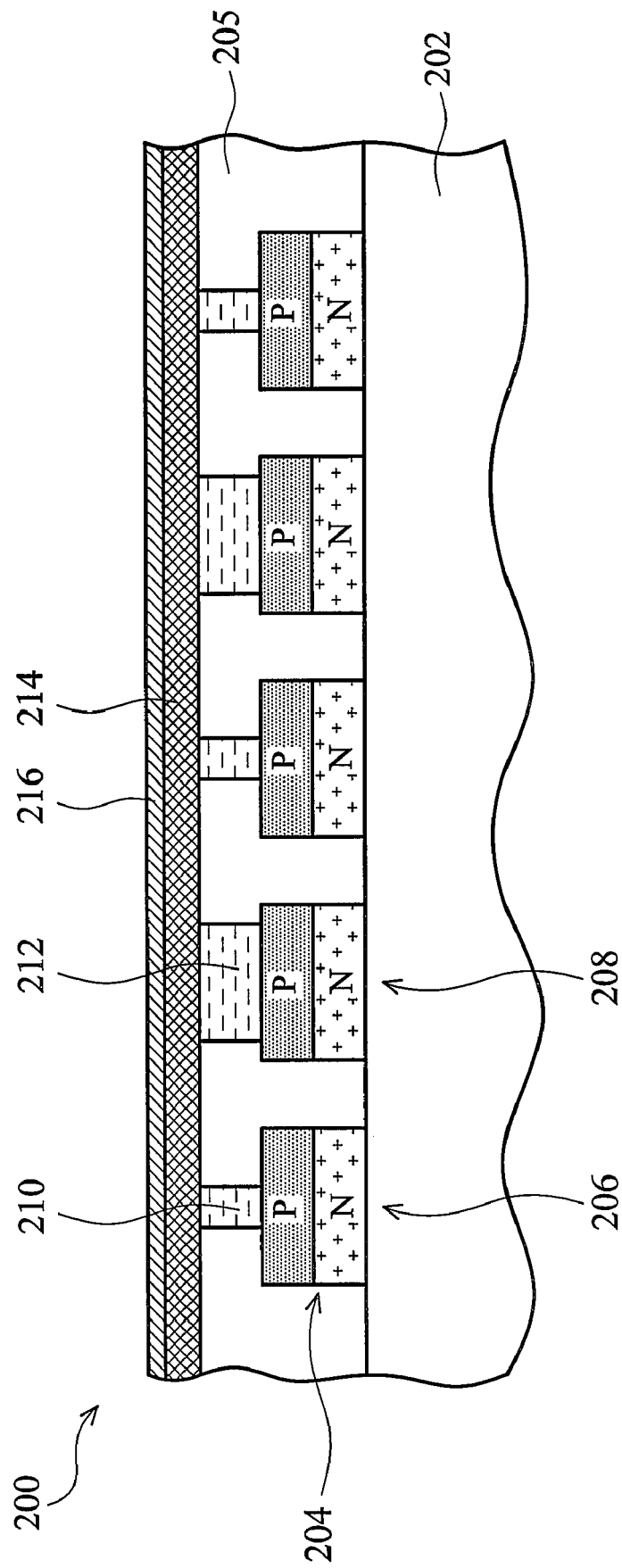
Figure 2D:
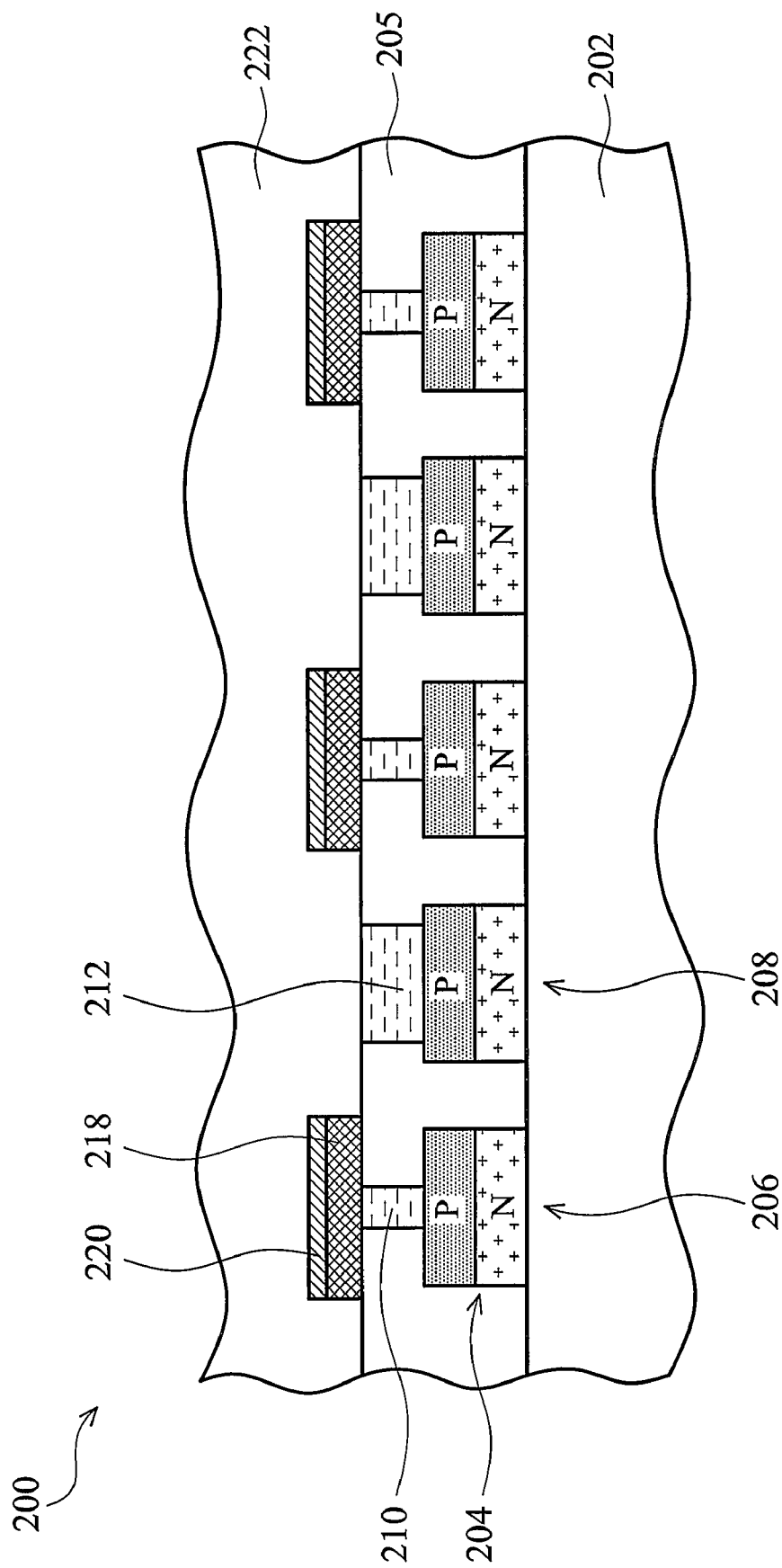

Referring to FIG. 2C, a phase change material 214, such as Ge—Te—Sb chalcogenide, is blanketly deposited on the first dielectric layer 205, followed by blanketly depositing electrode material 216, such as TiN or TiW, on the phase change material 214. Referring to FIG. 2D, the phase change material 214 and the electrode material 216 are patterned by lithography and etching to form a patterned phase change layer 218 on the bottom electrode 210 of the first cell 206 and a top electrode 220 on the patterned phase change layer 218. Thereafter, a second dielectric layer 222 is deposited by, for example, chemical vapor deposition (CVD) on the top electrode 220 and the first dielectric layer 205. The second dielectric layer 222 can be silicon oxide, silicon nitride or silicon oxynitride.

Figure 2E:
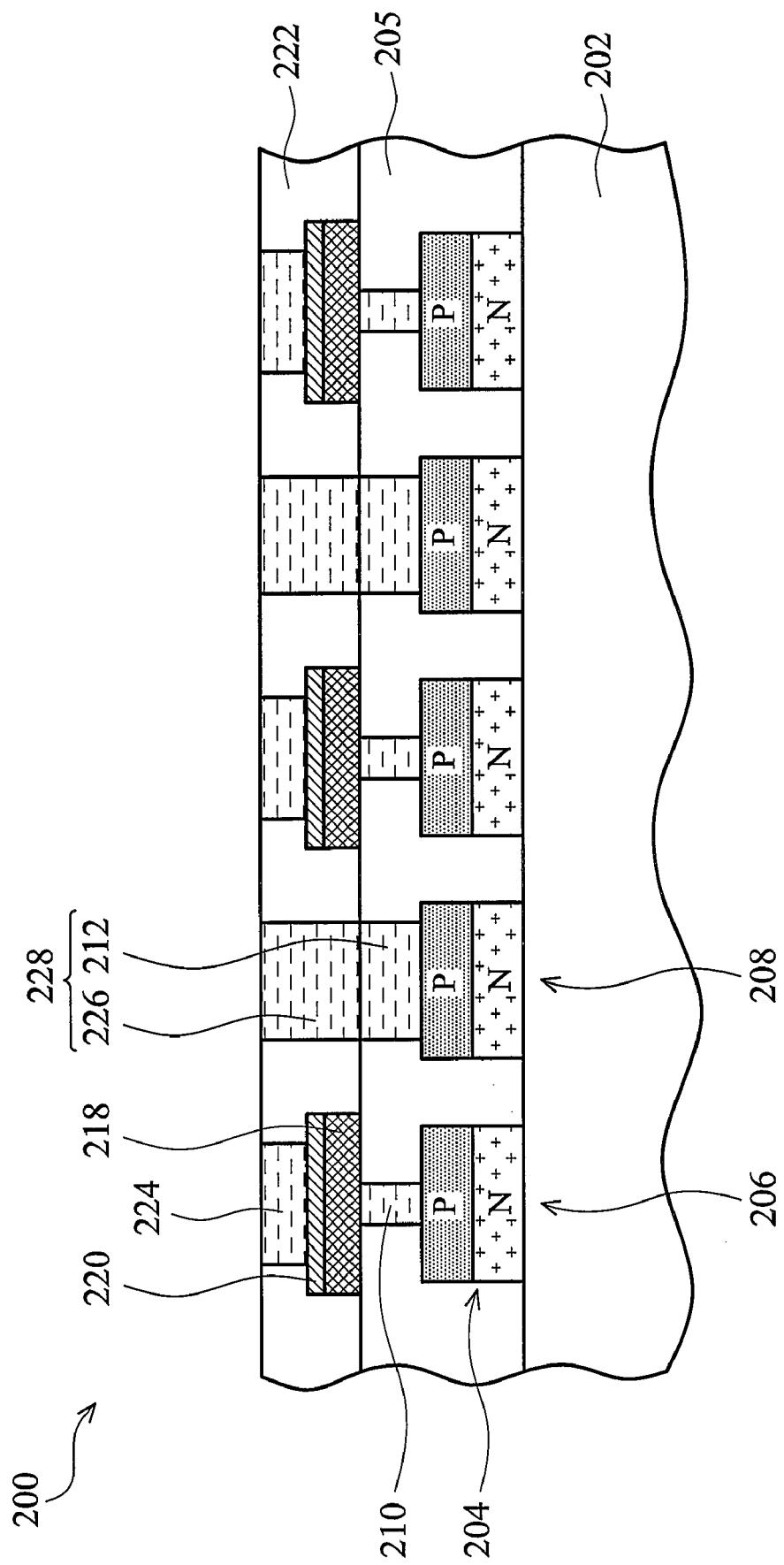

Referring to FIG. 2E, the second dielectric layer 222 is polished by, for example, chemical mechanical polishing (CMP) and then patterned by lithography and etching to form a plurality of openings (not shown). The openings are filled with conductive material, such as tungsten, to form a portion 224 of the interconnect on the top electrode 220 of the first cell 206, and form another portion 226 of the interconnect on a portion 212 of the interconnect of the second cell 208. The portions 212 and 226 constitute an entire interconnect 228 below the phase change layer of the second cell 208.

Figure 2F:
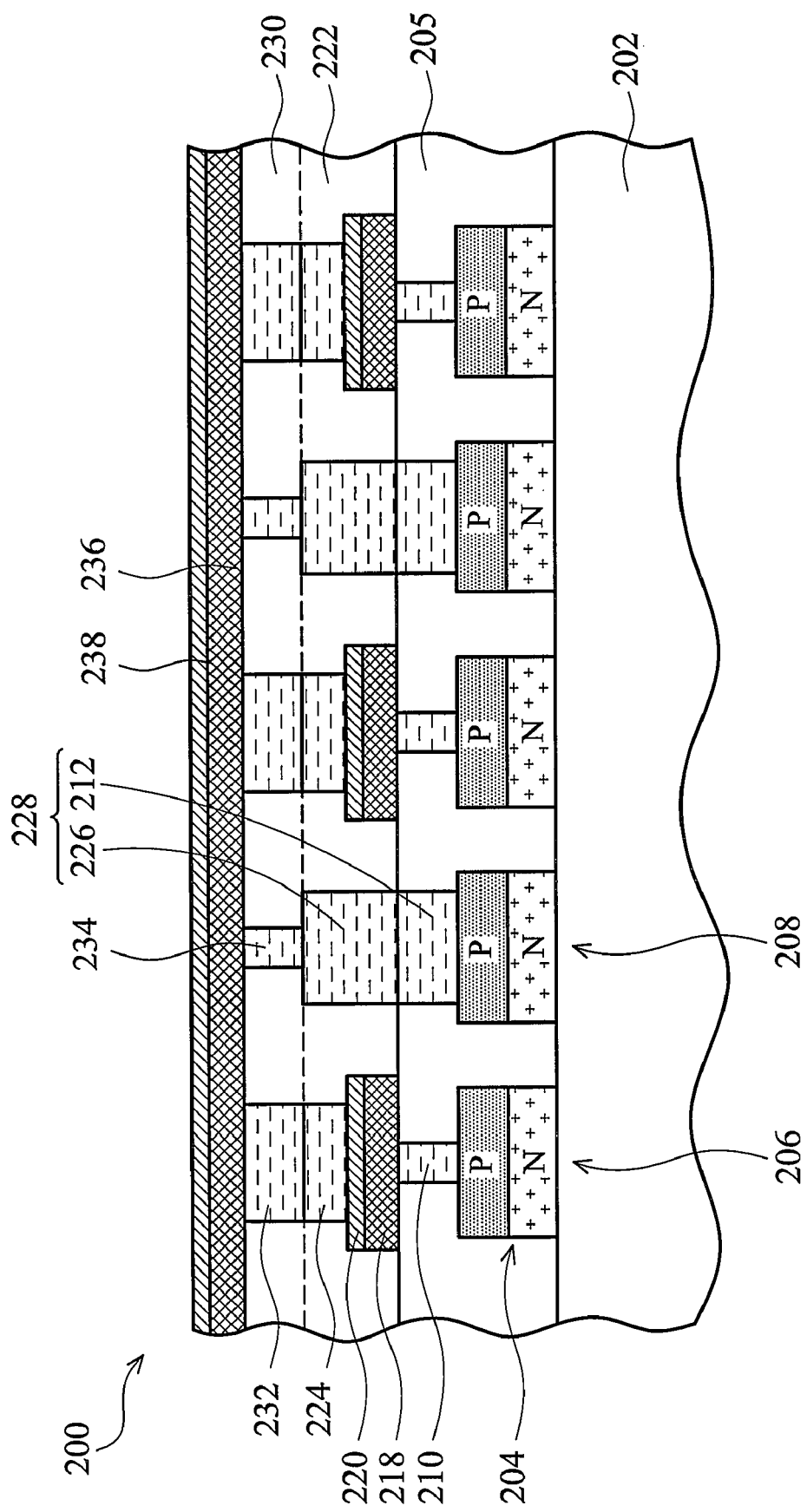
Figure 2G:
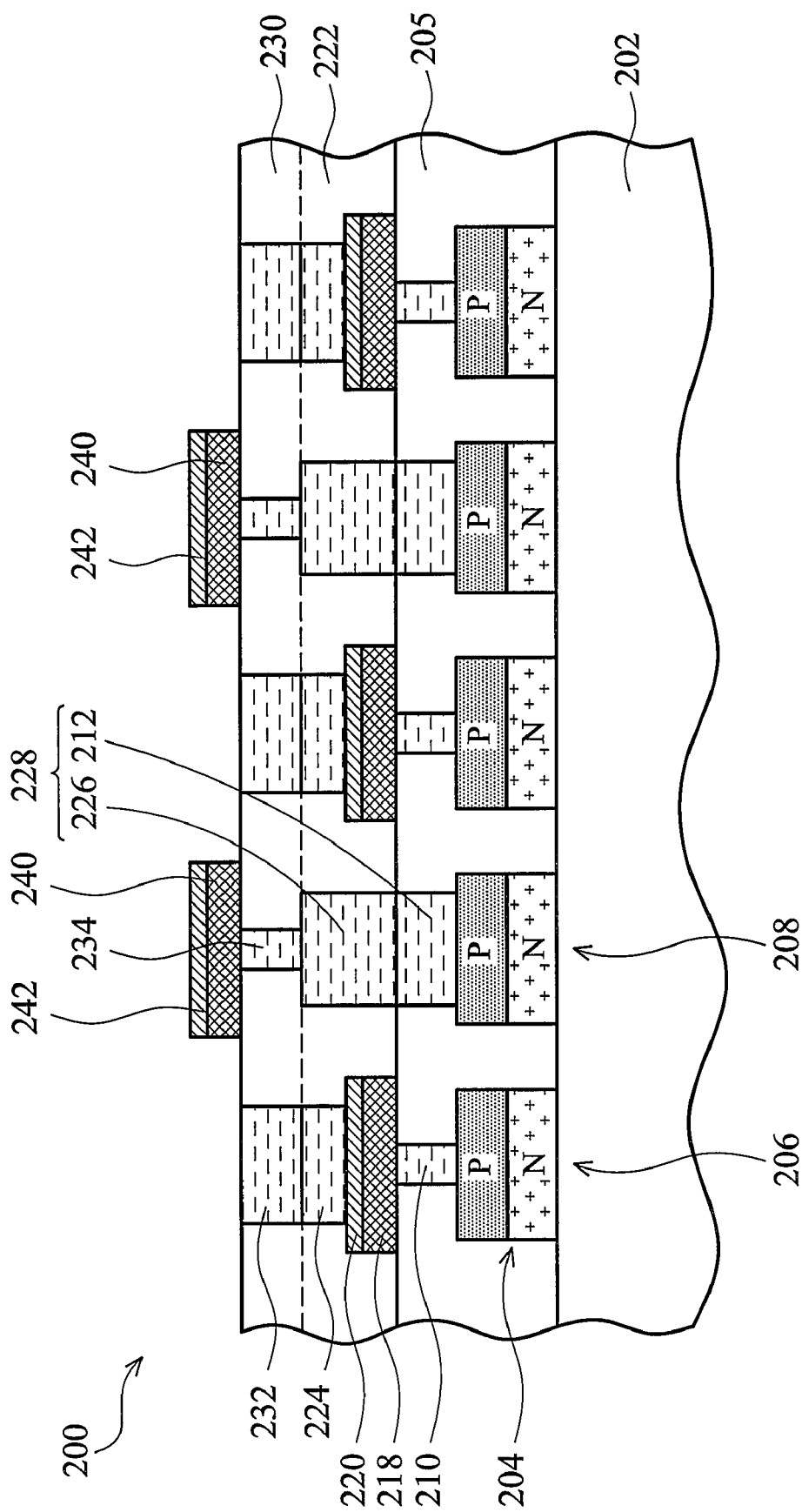

Referring to FIG. 2F, a third dielectric layer 230, such as silicon oxide, silicon nitride or silicon oxynitride, is formed on the second dielectric layer 222 by, for example, chemical vapor deposition and then patterned by lithography and etching to form a plurality of openings (not shown). Conductive material, such as Ti, W, Ta, TiN, TiW, TaN, TaW, TiAl, TiWN, TiAlN, or Poly-Si, is filled into the openings to form another portion 232 of interconnect on the portion 224 of interconnect of the first cell 206 and form a bottom electrode 234 on the interconnect 228 of the second cell 208. Next, a phase change material 236, such as such as Ge—Te—Sb chalcogenide, is formed on the third dielectric layer 230 and an electrode material 238, such as TiN or TiW, is deposited on the phase change material 236. Referring to FIG. 2G, the phase change material 236 and the electrode material 238 are patterned by lithography and etching to form a patterned phase change layer 240 on the bottom electrode 234 of the second cell 208 and form a top electrode 242 on the patterned phase change layer 240. Note that the patterned phase change layer 240 of the second cell 208 and the patterned phase change layer 218 of the first cell 206 are at different levels and both are horizontally separated by a distance.

Figure 2H:
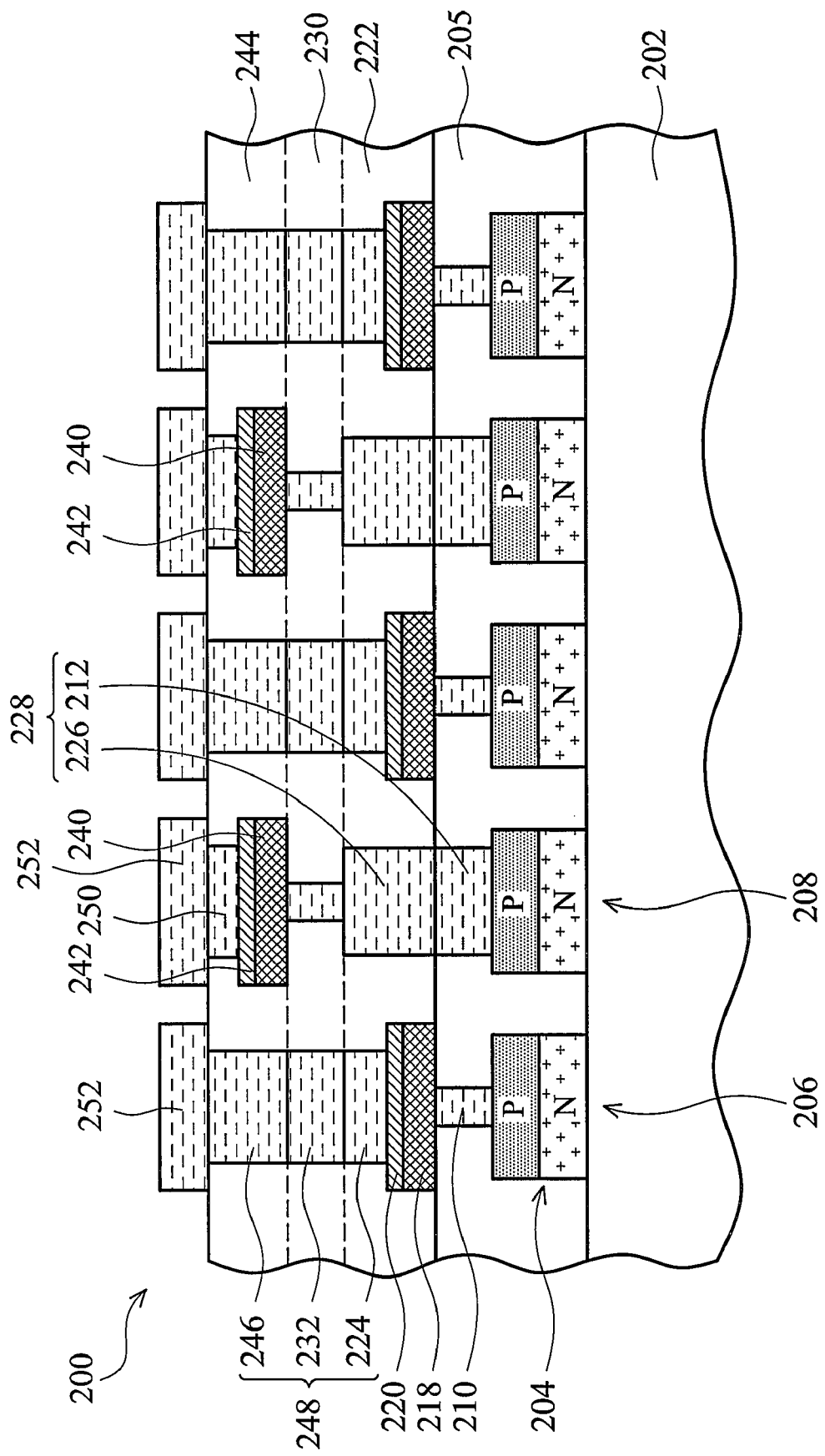

Referring to FIG. 2H, a fourth dielectric layer 244, such as silicon oxide, silicon nitride or silicon oxynitride, is formed by, for example, chemical vapor deposition, on the top electrode 242 of the second cell 208 and the third dielectric layer 230 and then patterned by lithography and etching to form openings (not shown), followed by filling of a conductive material, such as tungsten, to form another portion 246 of the interconnect on the portion 232 of the interconnect, constituting an entire interconnect 248 on the top electrode 220 of the first cell 206, and also form an interconnect 250 on the top electrode 242 of the second cell 208. Thereafter, a plurality of bit lines 252 are formed to respectively connect interconnects 248 and 250 of the first cell 206 and the second cell 208.

Thus, a phase change memory array 200 of the embodiment is formed. As shown in FIG. 2H, the first cell 206 neighbors the second cell 208 and both have phase change layers 218 and 240 at different levels. In an embodiment of the invention, a horizontal distance between the first cell 206 and the second cell 208 is about 250 nm and interconnecting lengths of the neighboring cells are different. For example, the interconnect 248 on the top electrode 220 of the first cell 206 is longer than the interconnect 250 on the top electrode 242 of the second cell 208.

Figure 3:
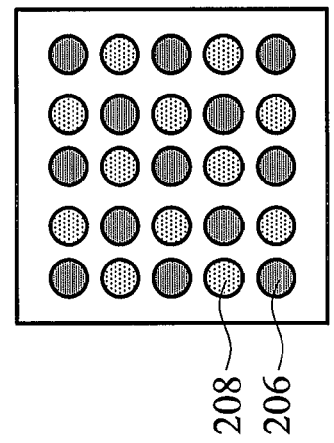
FIG. 3 shows a plan view of the phase change memory array of an embodiment of the invention.

Referring to FIG. 3, which shows a plan view of the phase change memory array of an embodiment of the invention, the phase change layers of the neighboring first cell 206 and second cell 208 are respectively disposed at a first layer and a second layer. The invention can comprise phase change layers of the first cell 206 and second cell 208 respectively disposed at other layers with different levels. For example, the phase change layers of the first cell 206 and second cell 208 are respectively disposed at a first layer and a Nth layer, wherein N is 2~10.

Figure 4:
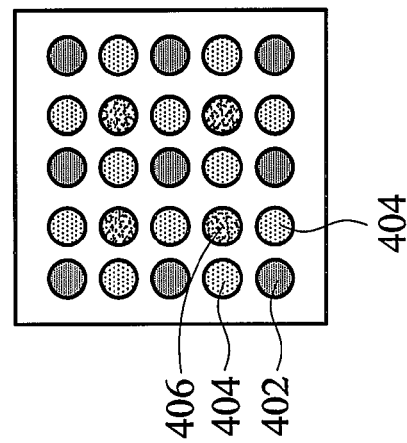
FIG. 4 shows a plan view of the phase change memory array of another embodiment of the invention.

Referring to FIG. 4, which shows a plan view of the phase change memory array of another embodiment of the invention, a second cell 404 and a third cell 406 neighbors the first cell 402 and the horizontal distance between the third cell 406 and the first cell 402 is longer than that between the second cell 404 and the first cell 402. The patterned phase change layers of the first cell 402 and the second cell 404 are vertically separated by layers that are more than that between the first cell 402 and the third cell 406. In a example of the invention, the phase change layer of the first cell 402 is disposed at a first layer, the phase change layer of the second cell 404 directly adjacent to the first cell 402 is disposed at the third layer, and the phase change layer of the third cell 406 obliquely adjacent to the first cell 402 is disposed at the second layer. Note that the memory array of the invention comprising cells with phase change layers at three different layers is not limited only to that shown in FIG. 4 but other types of memory arrays can also be used.

Figure 5:
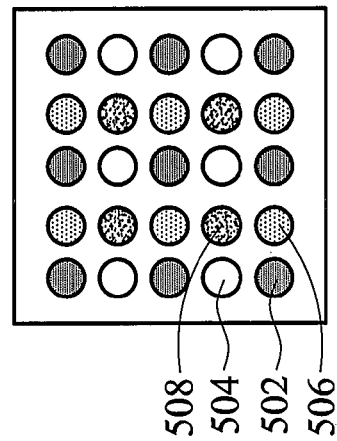
FIG. 5 shows a plan view of the phase change memory array of yet another embodiment of the invention.

Referring to FIG. 5, which shows a plan view of the phase change memory array of yet another embodiment of the invention, wherein the second cell 504, the third cell 506 and the fourth cell 508 neighbors the first cell 502. The phase change layers of the first, second, third and fourth cells 502, 504, 506 and 508 are respectively disposed at different layers. The horizontal distance between the fourth cell 508 and the first cell 502 is longer than that between the second cell 504 and the first cell 502, and longer than that between the third cell 506 and the first cell 502. The patterned phase change layers of the fourth cell 508 and the first cell 502 are separated by layers that are more than that between the first cell 502 and the second cell 504, and more than that between the first cell 502 and the third cell 506. In an example of the invention, the phase change layer of the first cell 502 is disposed at a first layer, the phase change layers of the second cell 504 and the third cell 506 directly adjacent to the first cell 502 is respectively disposed at the third layer and the fourth layer and the phase change layer of the fourth cell 508 obliquely adjacent to the first cell 502 are disposed at the second layer. Note that the memory array of the invention comprising cells with phase change layers at four different layers is not limited only to that shown in FIG. 5 but other types of memory arrays can also be used.

Figure 6A:
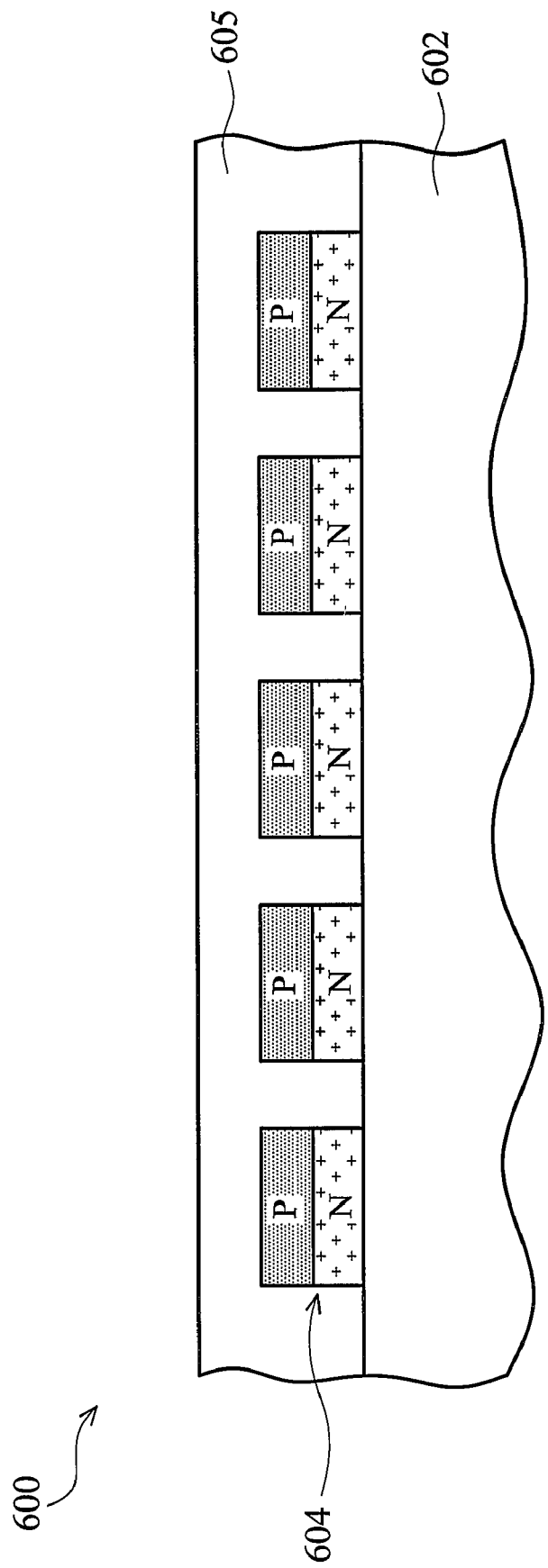
FIG. 6A~FIG. 6H illustrate the fabrication flow of a phase change memory array of another embodiment of the invention.

FIG. 6A~FIG. 6H illustrate the fabrication flow of a phase change memory array 600 of another embodiment of the invention. Referring to FIG. 6A, a substrate 602 is provided. A plurality of switch devices 604 are formed on the substrate 602. A first dielectric layer 605, such as silicon oxide, silicon nitride or silicon oxynitride, is formed on the switch devices 604 and the substrate 602.

Figure 6B:
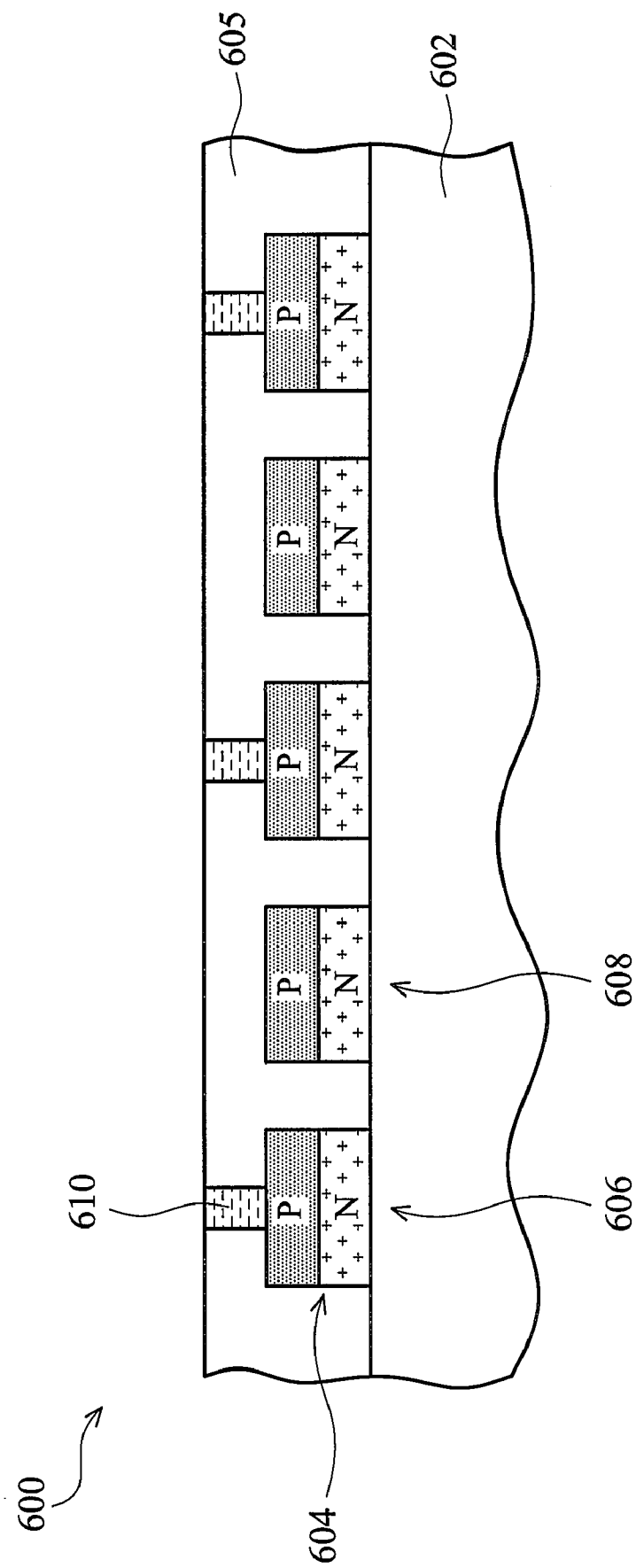
Figure 6C:
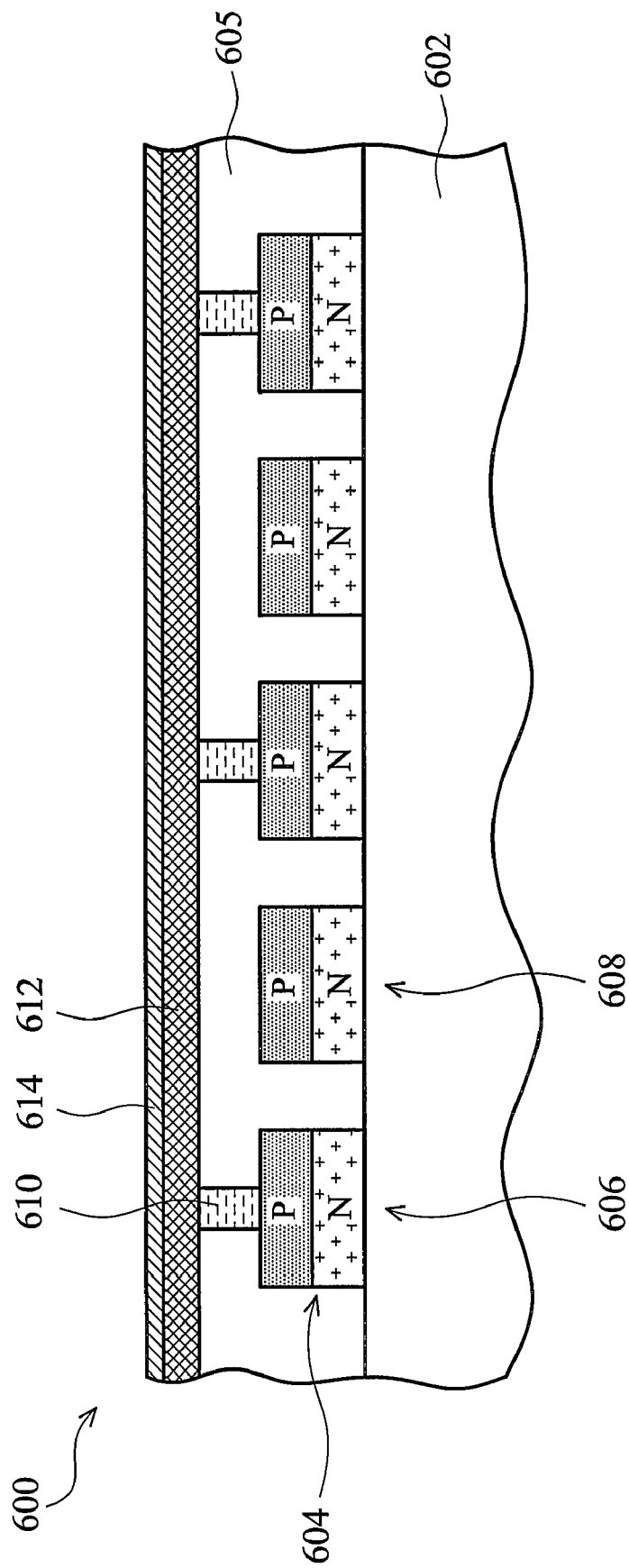

Referring to FIG. 6B, the first dielectric layer 605 is patterned using, for example, lithography and etching, to form openings (not shown) exposing the switch devices 604, followed by filling of the opening with a conductive material, such as Ti, W, Ta, TiN, TiW, TaN, TaW, TiAl, TiWN, TiAlN, or poly silicon to form a bottom electrode 610 of a first cell 606. Referring to FIG. 6C, phase change material 612, such as Ge—Te—Sb chalcogenide, is blanketly deposited on the first dielectric layer 605 and electrode material 614, such as TiN or TiW, is blanketly deposited on the phase change material 612.

Figure 6D:
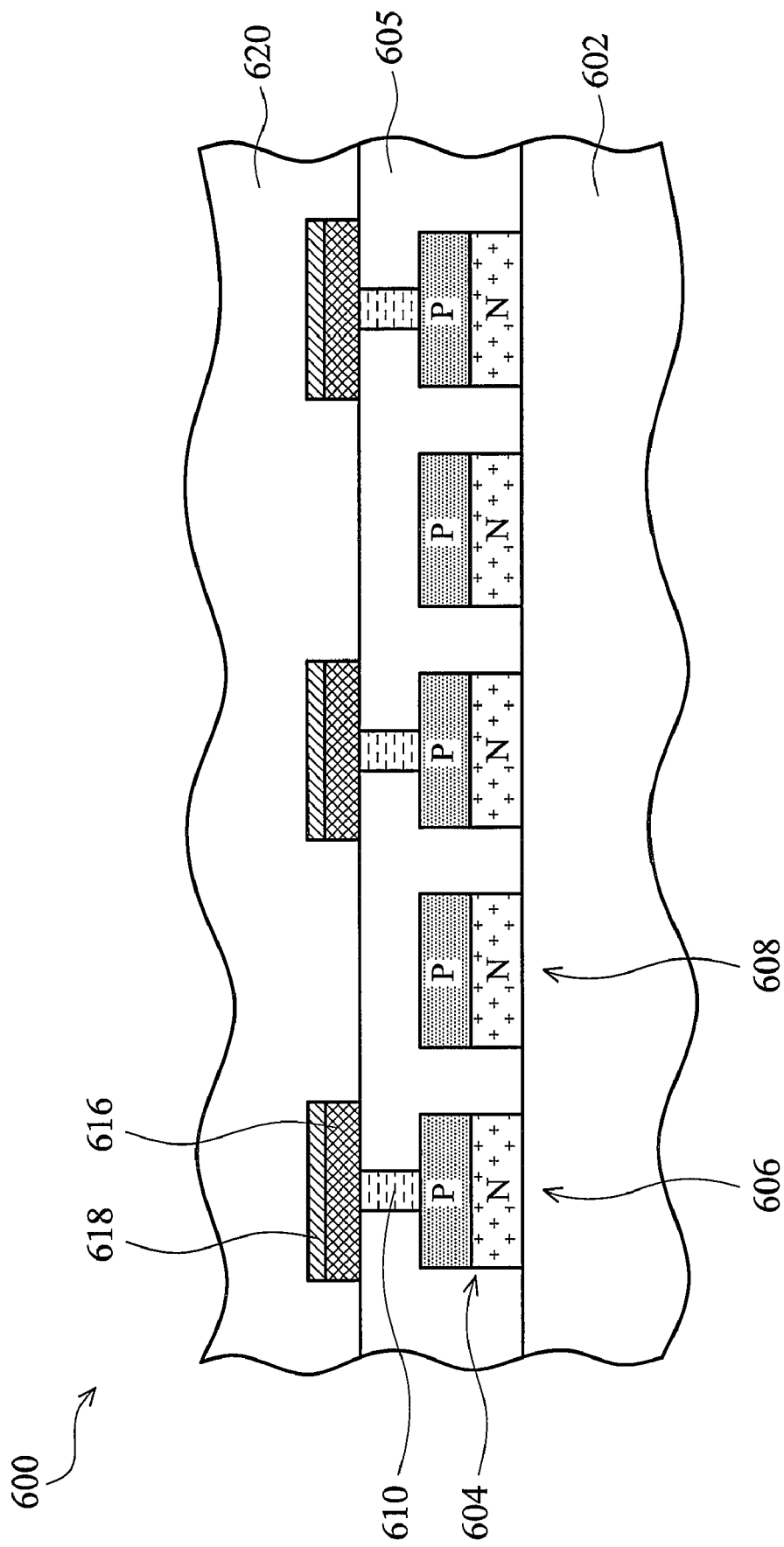

Referring to FIG. 6D, the phase change material 612 and the electrode material 614 are patterned by lithography and etching to form a patterned phase change layer 616 on the bottom electrode 610 of the first cell 606 and a top electrode 618 of the first cell 606 on the patterned phase change layer 616. Thereafter, a second dielectric layer 620, such as silicon oxide, silicon nitride or silicon oxynitride, is deposited by, for example, chemical vapor deposition (CVD), on the top electrode 618 and the first dielectric layer 605.

Figure 6E:
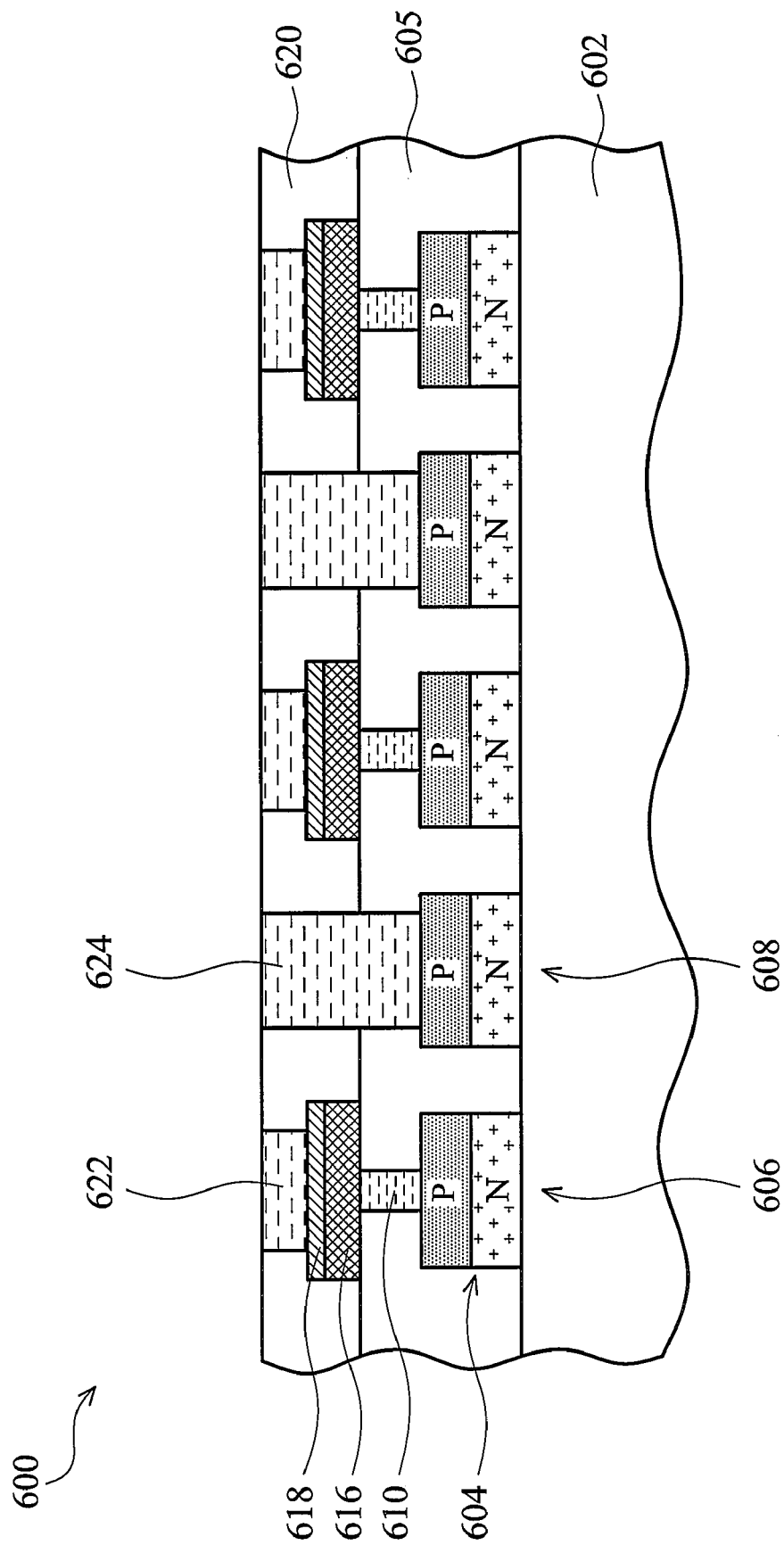

Referring to FIG. 6E, the second dielectric layer 620 is polished by, for example, chemical mechanical polishing, and then patterned by lithography and etching to form openings (not shown). The openings are filled with conductive material, such as tungsten, to form a portion 622 of the interconnect on the top electrode 618 of the first cell 606 and form an interconnect 624 below a phase change layer of the second cell 608.

Figure 6F:
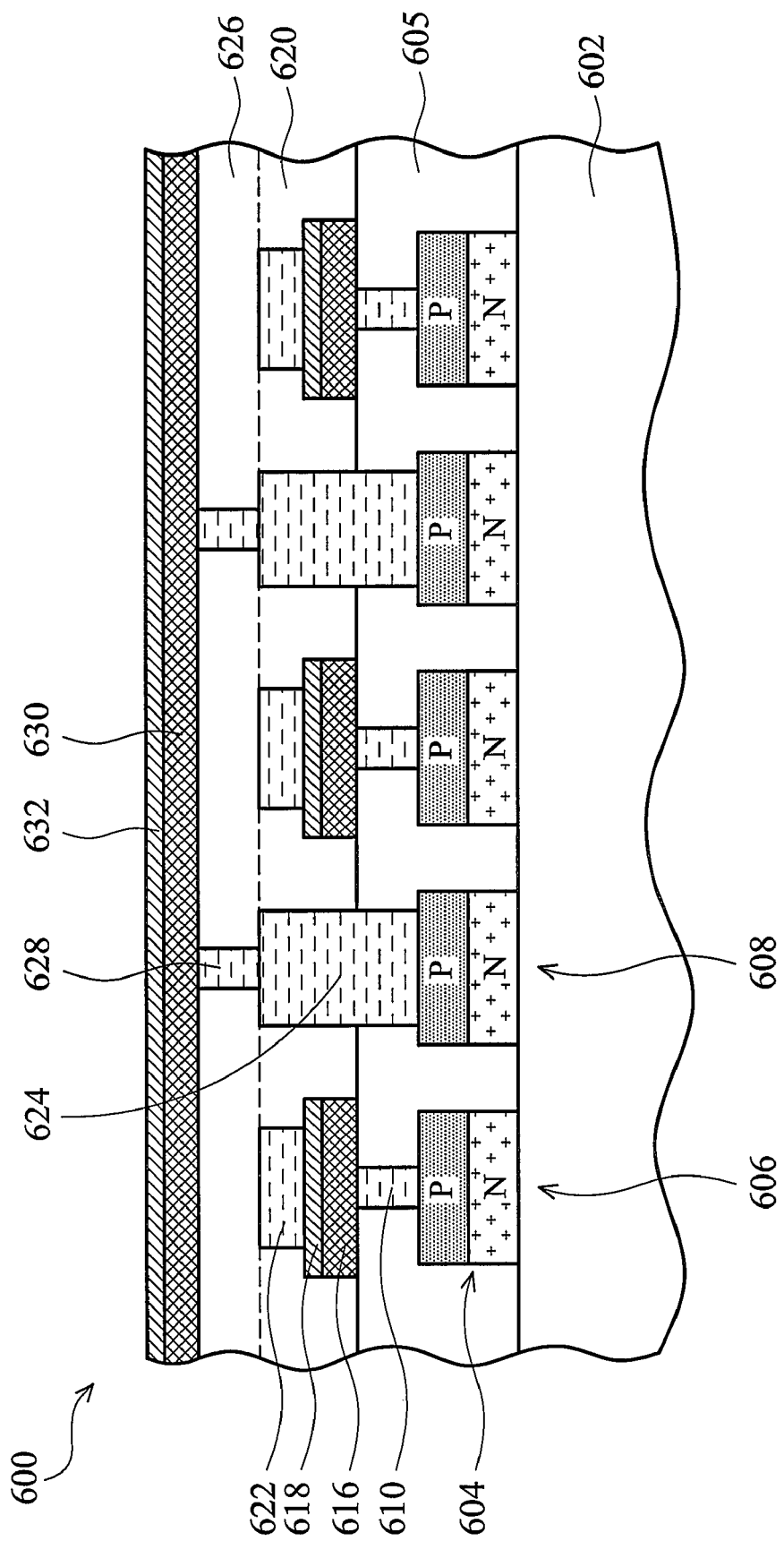

Referring to FIG. 6F, a third dielectric layer 626, such as silicon oxide, silicon nitride or silicon oxynitride, is formed on the second dielectric layer 620 by, for example, chemical vapor deposition and then patterned by lithography and etching to form an opening (not shown). Conductive material, such as Ti, W, Ta, TiN, TiW, TaN, TaW, TiAl, TiWN, TiAlN, or Poly-Si, is filled into the opening to form a bottom electrode 628 on the interconnect 624 of the second cell 608. Next, a phase change material 630, such as such as Ge—Te—Sb chalcogenide, is deposited on the third dielectric layer 626 and an electrode material 632, such as TiN or TiW, is deposited on the phase change material 630.

Figure 6G:
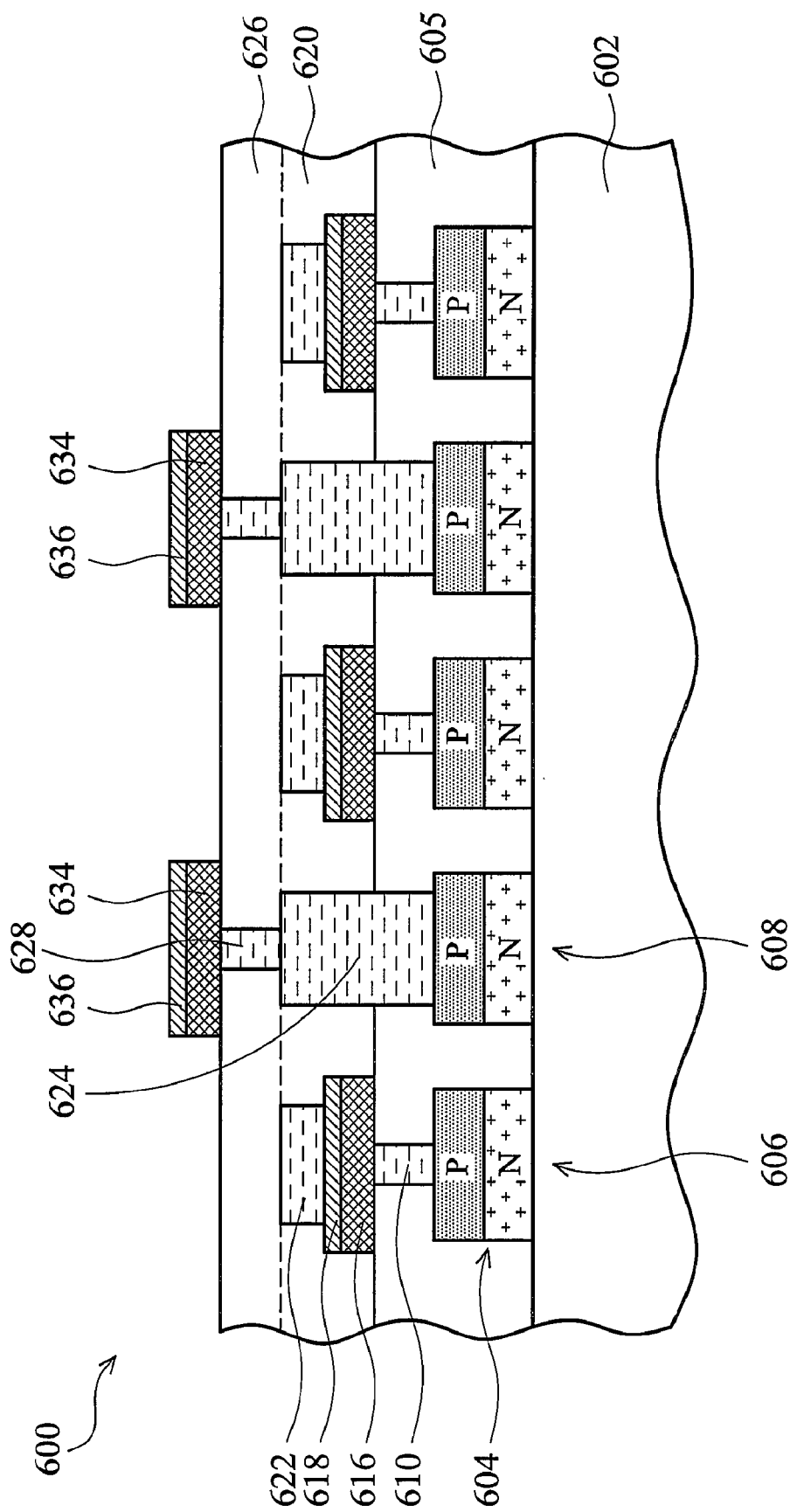

Referring to FIG. 6G, the phase change material 630 and the electrode material 632 are patterned by lithography and etching to form a patterned phase change layer 634 on the bottom electrode 628 of the second cell 608 and a top electrode 636 on the patterned phase change layer 634. Note that the patterned phase change layer 634 of the second cell 608 and the patterned phase change layer 616 of the first cell 606 are at different layers and are horizontally separated by a distance.

Figure 6H:
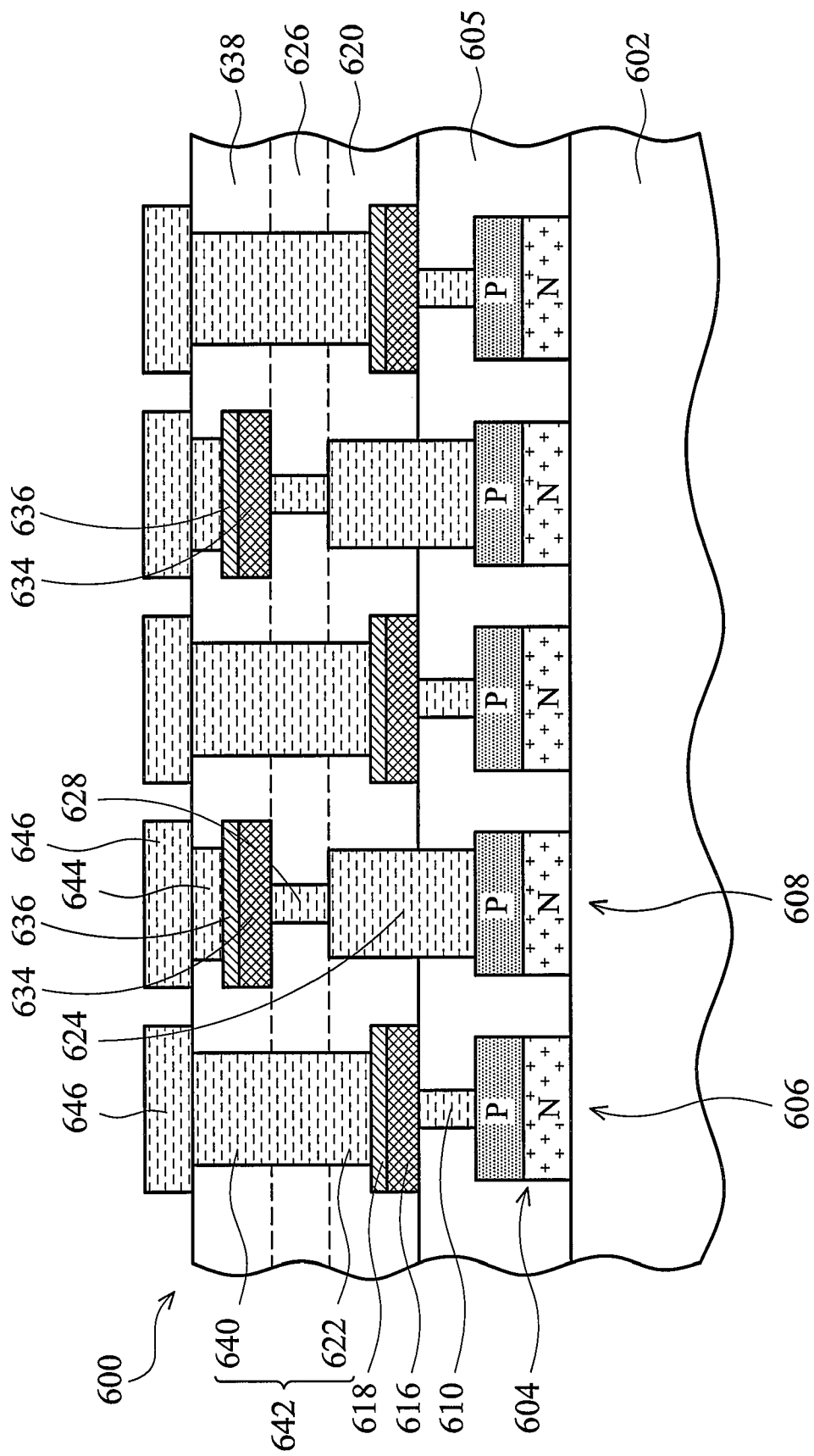

Referring to FIG. 6H, a fourth dielectric layer 638, such as silicon oxide, silicon nitride or silicon oxynitride, is formed by, for example, chemical vapor deposition on the top electrode 636 of the second cell 608 and the third dielectric layer 626 and then patterned by lithography and etching to form openings (not shown), followed by filling of the openings with a conductive material, such as tungsten, to form another portion 622 of the interconnect on the portion of the interconnect 640. An entire interconnect 642 on the top electrode 618 of the first cell 606 is formed and an interconnect 644 on the top electrode 636 of the second cell 608 is formed simultaneously. Thereafter, a plurality of bit lines 646 are formed, respectively connecting interconnects 642 and 644 of the first cell 606 and the second cell 608.

In accordance with the embodiments described, the cells of the phase change array are staggered and disposed at different layers and the distance between neighboring memory cells is effectively elongated. Hence, the programming disturbs of the phase change memory is eliminated. The embodiment of the invention can eliminate programming disturbs without increasing area of a unit cell. Thus, a high density phase change memory can be still achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory array, comprising:
   a first cell, comprising a patterned phase change layer and a top electrode on the patterned phase change layer; and
   a second cell, comprising a patterned phase change layer and a top electrode on the patterned phase change layer, wherein the patterned phase change layer of the first cell and the patterned phase change layer of the second cell are disposed at different layers,
   and the top electrode of the first cell and the top electrode of the second cell are disposed at different layers.

2. The phase change memory array as claimed in claim 1, wherein the first cell neighbors the second cell.

3. The phase change memory array as claimed in claim 2, further comprising a third cell comprising a patterned phase change layer, and the patterned phase change layer of the third cell is disposed at a different layer from the patterned phase change layers of the first cell and the second cell.

4. The phase change memory array as claimed in claim 3, wherein the third cell and the first cell are separated by a horizontal distance longer than that between the second cell and the first cell, and the patterned phase change layer of the first cell and the patterned phase change layer of the second cell are separated by layers that are more than that between the first cell and the third cell.

5. The phase change memory array as claimed in claim 4, wherein the patterned phase change layer of the first cell is disposed at a first layer, the phase change layer of the second cell directly adjacent to the first cell is disposed at a third layer, and the phase change layer of the third cell obliquely adjacent to the first cell is disposed at a second layer.

6. The phase change memory array as claimed in claim 3, further comprising a fourth cell comprising a patterned phase change layer, wherein the patterned phase change layer of the fourth cell is disposed at a different layer from the patterned phase change layers of the first, second and third cells.

7. The phase change memory array as claimed in claim 6, wherein the fourth cell and the first cell are separated by a horizontal distance longer than that between the second cell and the first cell and longer than that between the third cell and the first cell, and the patterned phase change layer of the first cell and the patterned phase change layer of the fourth cell are separated by layers less than that between the first cell and the second cell and less than that between the first cell and the third cell.

8. The phase change memory array as claimed in claim 7, wherein the patterned phase change layer of the first cell is disposed at a first layer, the phase change layers of the second and third cells directly adjacent to the first cell are disposed at a third layer and a fourth layer respectively, and the phase change layer of the fourth cell obliquely adjacent to the first cell is disposed at a second layer.

9. The phase change memory array as claimed in claim 1, wherein the patterned phase change layer of first cell and the patterned phase change layer of second cell are separated by at least one layer.

10. The phase change memory array as claimed in claim 9, wherein the patterned phase change layer of first cell and the patterned phase change layer of second cell are separated by at least two layers.

11. The phase change memory array as claimed in claim 1, wherein the first cell or the second cell is electrically connected to a switch element.

12. The phase change memory array as claimed in claim 11, wherein the switch element is a vertical diode, a bipolar junction transistor (BJT) or a metal oxide field transistor (MOSFET).

13. The phase change memory array as claimed in claim 1, wherein the first cell and the second cell are separated by a horizontal distance substantially less than 250 nm.

14. The phase change memory array as claimed in claim 1, wherein the interconnect above the top electrode of the first cell is longer than that above the top electrode of the second cell.

15. The phase change memory array as claimed in claim 1, wherein the patterned phase change layer comprises phase change material of chalcogenide.

16. A method for forming a phase change memory array, comprising:
   providing a substrate;
   forming a bottom electrode, a patterned phase change layer and a top electrode of a first cell on the substrate; and
   forming a bottom electrode, a patterned phase change layer and a top electrode of a second cell after forming the top electrode of the first cell,
   wherein the top electrode of the first cell and the top electrode of the second cell are disposed at different layers.

17. The method for forming a phase change memory array as claimed in claim 16, wherein a portion of an interconnect of the second cell is formed before forming the bottom electrode of the second cell and the portion of the interconnect of the second cell and the bottom electrode of the first cell are formed during the same step.

18. The method for forming a phase change memory array as claimed in claim 17, wherein the portion of the interconnect of the second cell and the bottom electrode comprise Ti, W, Ta, TiN, TiW, TaN, TaW, TiAl, TiWN, TiAlN, or poly silicon.

19. The method for forming a phase change memory array as claimed in claim 16, wherein after forming the top electrode of the first cell, further comprising forming a portion of an interconnect above the top electrode of the first cell and simultaneously forming a portion of an interconnect below the bottom electrode of the second cell.

20. The method for forming a phase change memory array as claimed in claim 16, further comprising simultaneously forming a portion of an interconnect above the top electrode of the first cell and an entire interconnect below the bottom electrode of the second cell.

* * * * *